(12) United States Patent
Crowley et al.

(10) Patent No.: US 6,605,866 B1
(45) Date of Patent: Aug. 12, 2003

(54) STACKABLE SEMICONDUCTOR PACKAGE AND METHOD FOR MANUFACTURING SAME

(75) Inventors: Sean Timothy Crowley, Phoenix, AZ (US); Angel Orabuena Alvarez, Gilbert, AZ (US); Jun Young Yang, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/687,531

(22) Filed: Oct. 13, 2000

(30) Foreign Application Priority Data

Dec. 16, 1999 (KR) .............................. 99-58166

(51) Int. Cl.⁷ .............................................. H01L 23/48
(52) U.S. Cl. ...................... 257/692; 257/777; 438/123
(58) Field of Search ............................... 257/692, 777; 438/123

(56) References Cited

U.S. PATENT DOCUMENTS

| | | | |
|---|---|---|---|
| 4,530,152 A | 7/1985 | Roche et al. ................. 29/588 |
| 5,041,902 A | 8/1991 | McShane ..................... 357/79 |
| 5,157,480 A | 10/1992 | McShane et al. ............. 357/74 |
| 5,172,213 A | 12/1992 | Zimmerman ................ 257/796 |
| 5,172,214 A | 12/1992 | Casto ......................... 257/676 |
| 5,278,446 A | 1/1994 | Nagaraj et al. ............. 257/707 |
| 5,428,248 A | 6/1995 | Cha ........................... 257/676 |
| 5,521,429 A | 5/1996 | Aono et al. ................. 257/676 |
| 5,701,034 A | 12/1997 | Marrs ......................... 257/706 |
| 5,770,888 A | * 6/1998 | Song et al. .................. 257/696 |
| 5,783,861 A | 7/1998 | Son ............................ 253/693 |
| 5,835,988 A | 11/1998 | Ishii ........................... 257/684 |
| 5,866,939 A | 2/1999 | Shin et al. ................... 257/666 |
| 5,894,108 A | 4/1999 | Mostafazadeh et al. .... 174/52.4 |
| 5,939,779 A | * 8/1999 | Kim ............................ 257/673 |
| 5,977,613 A | 11/1999 | Takata et al. ................ 257/666 |
| 5,977,630 A | 11/1999 | Woodworth et al. ........ 257/712 |
| 6,043,430 A | * 3/2000 | Chun ......................... 174/52.4 |

(List continued on next page.)

FOREIGN PATENT DOCUMENTS

| | | |
|---|---|---|
| JP | 57-45959 | 3/1982 |
| JP | 58-101317 | 6/1983 |
| JP | 58-160095 | 9/1983 |
| JP | 61-39555 | 2/1986 |
| JP | 62-9639 | 1/1987 |
| JP | 63-205935 | 8/1988 |
| JP | 63-233555 | 9/1988 |
| JP | 64-54749 | 3/1989 |
| JP | 07-312405 | 11/1995 |
| JP | 08-125066 | 5/1996 |

(List continued on next page.)

*Primary Examiner*—Richard Elms
*Assistant Examiner*—Christian D. Wilson
(74) *Attorney, Agent, or Firm*—Stetina Brunda Garred & Brucker

(57) ABSTRACT

Micro lead frame (MLF)-type semiconductor packages that allow the semiconductor packages to be stacked on top of each other. One aspect of the semiconductor package includes a leadframe, a plurality of electrical connectors, a semiconductor chip, and a sealing material for encapsulating the above components. The leadframe has a plurality of leads, with each one of the plurality of leads running from the top of the semiconductor package to the bottom of the semiconductor package. Each one of the plurality of leads has a top portion protruding from the top surface of the semiconductor package and a bottom portion protruding from the bottom surface of the semiconductor package. The leads allow for electrical connection of a second semiconductor package placed on top of the first semiconductor package. Further, the protruding parts of the leads form a space between the stacked semiconductor packages for improved heat dissipation.

25 Claims, 18 Drawing Sheets

U.S. PATENT DOCUMENTS

| | | | |
|---|---|---|---|
| 6,075,284 A | * | 6/2000 | Choi et al. .................. 257/676 |
| 6,118,174 A | * | 9/2000 | Kim ........................... 257/676 |
| 6,143,981 A | | 11/2000 | Glenn ...................... 174/52.4 |
| 6,229,200 B1 | | 5/2001 | Mclellan et al. ............ 257/666 |
| 6,242,281 B1 | | 6/2001 | Mclellan et al. ............ 438/106 |
| 6,294,100 B1 | | 9/2001 | Fan et al. ..................... 216/14 |
| 6,294,830 B1 | * | 9/2001 | Fjelstad ...................... 257/724 |
| 6,323,550 B1 | * | 11/2001 | Martin et al. ................ 257/704 |
| 6,339,255 B1 | * | 1/2002 | Shin ........................... 257/686 |
| 6,355,502 B1 | | 3/2002 | Kang et al. ................. 438/110 |
| 6,395,578 B1 | * | 5/2002 | Shin et al. .................. 438/106 |

FOREIGN PATENT DOCUMENTS

| | | |
|---|---|---|
| JP | 08-306853 | 11/1996 |
| JP | 09-8205 | 1/1997 |
| JP | 09-8206 | 1/1997 |
| JP | 09-8207 | 1/1997 |
| JP | 09-92775 | 4/1997 |
| KR | 92-10286 A | 6/1992 |
| KR | 92-10286 B | 11/1992 |
| KR | 96-9774 A | 3/1996 |
| KR | 96-9774 B | 7/1996 |

\* cited by examiner

STACKABLE SEMICONDUCTOR PACKAGE AND METHOD FOR MANUFACTURING SAME

BACKGROUND OF THE INVENTION

1. Field of the Invention

The present invention relates to semiconductor packages, leadframe assemblies therefor, and a method of manufacture, and more particularly, but not by way of limitation, to micro lead frame (MLF)-type semiconductor packages that allow the semiconductor packages to be stacked one atop the other.

2. History of Related Art

It is conventional in the electronic industry to encapsulate one or more semiconductor devices, such as integrated circuit dies, or chips, in a semiconductor package. These plastic packages protect a chip from environmental hazards, and provide a method of and apparatus for electrically and mechanically attaching the chip to an intended device. Recently, such semiconductor packages have included metal leadframes for supporting an integrated circuit chip which is bonded to a chip paddle region formed centrally therein. Bond wires which electrically connect pads on the integrated circuit chip to individual leads of the leadframe are then incorporated. A hard plastic encapsulating material, or encapsulant, which covers the bond wire, the integrated circuit chip and other components, forms the exterior of the package. A primary focus in this design is to provide the chip with adequate protection from the external environment in a reliable and effective manner.

As set forth above, the semiconductor package therein described incorporates a leadframe as the central supporting structure of such a package. A portion of the leadframe completely surrounded by the plastic encapsulant is internal to the package. Portions of the leadframe extend internally from the package and are then used to connect the package externally. More information relative to leadframe technology may be found in Chapter 8 of the book *Micro Electronics Packaging Handbook*, (1989), edited by R. Tummala and E. Rymaszewski, incorporated by reference herein. This book is published by Van Nostrand Reinhold, 115 Fifth Avenue, New York, N.Y.

Once the integrated circuit chips have been produced and encapsulated in semiconductor packages described above, they may be used in a wide variety of electronic appliances. The variety of electronic devices utilizing semiconductor packages has grown dramatically in recent years. These devices include cellular phones, portable computers, etc. Each of these devices typically include a printed circuit board on which a significant number of such semiconductor packages are secured to provide multiple electronic functions. These electronic appliances are typically manufactured in reduced sizes and at reduced costs, which results in increased consumer demand. Accordingly, not only are semiconductor chips highly integrated, but also semiconductor packages are highly miniaturized with an increased level of package mounting density.

According to such miniaturization tendencies, semiconductor packages, which transmit electrical signals from semiconductor chips to printed circuit boards and support the semiconductor chips on the printed circuit boards, have been designed to have a small size. By way of example only, such semiconductor packages may have a size on the order of 1×1 mm to 10×10 mm. Examples of such semiconductor packages are referred to as MLF (micro leadframe) type semiconductor packages and MLP (micro leadframe package) type semiconductor packages. Both MLF type semiconductor packages and MLP type semiconductor packages are generally manufactured in the same manner.

Even though semiconductor packages have been miniaturized, space on a printed circuit board remains limited and precious. Thus, there is a need to find both a method and a carrier package design to maximize the number of semiconductor packages that can be fitted onto an electronic device, yet minimize the space needed to attach these semiconductor packages. One method to minimize space needed to attach the semiconductor packages is to stack the semiconductor packages on top of each other.

Further, once the semiconductor packages are stacked onto each other, there is a need to be able to adequately dissipate the heat generated by the operation of each semiconductor chip in each one of the semiconductor chip packages.

SUMMARY OF THE INVENTION

The present invention relates to a micro lead frame (MLF)-type semiconductor packages that allow the semiconductor packages to be stacked on top of each other. More particularly, one aspect of the present invention comprises a semiconductor package that includes a leadframe, a plurality of electrical connectors, a semiconductor chip, and a sealing material for encapsulating the above components. The leadframe has a plurality of leads, with each one of the plurality of leads running from the top of the semiconductor package to the bottom of the semiconductor package. Each one of the plurality of leads has a top portion protruding from the top surface of the semiconductor package and a bottom portion protruding from the bottom surface of the semiconductor package. The leads allow for electrical connection of a second semiconductor package placed on top of the first semiconductor package. Further, the protruding parts of the leads form a space between the stacked semiconductor packages for improved heat dissipation.

BRIEF DESCRIPTION OF THE DRAWINGS

A more complete understanding of the method and apparatus of the present invention may be had by reference to the following detailed description when taken in conjunction with the accompanying drawings wherein.

DETAILED DESCRIPTION OF THE PREFERRED EMBODIMENT

Prior to discussing the various embodiments of the present invention, a prior art MLF-type semiconductor package will be discussed below in order to better understand MLF-type semiconductor packages in general.

Figure 1:
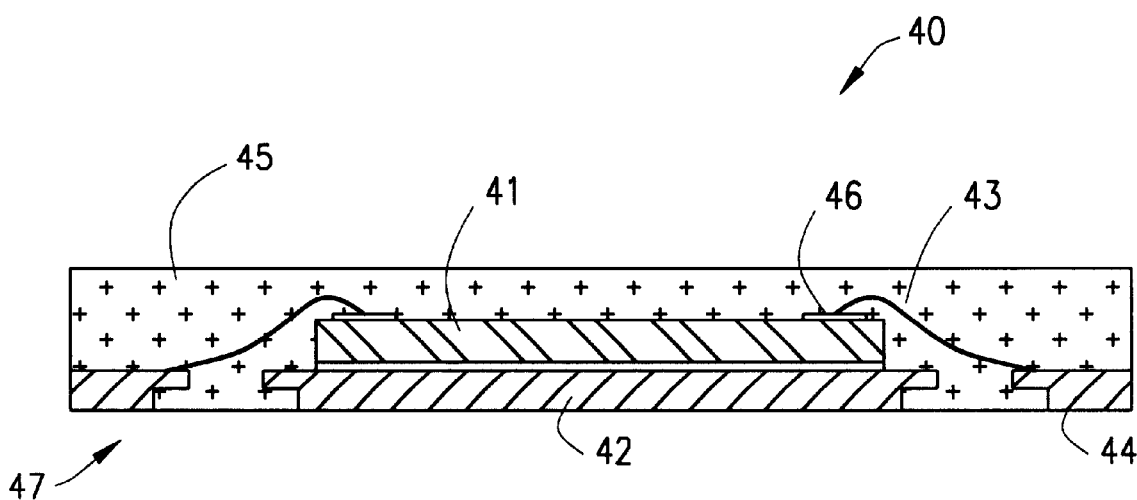
FIG. 1 is a cross-sectional view of a prior art MLF-type semiconductor package.

Referring first to FIG. 1, there is shown a side-elevational, cross-sectional view of a prior art MLF-type semiconductor package 40. Semiconductor package 40 has a leadframe 47 comprising a paddle 42 and a plurality of leads 44, a semiconductor chip 41, and a plurality of wires 43. The entire assembly is enclosed in a nonconductive sealing material 45 such as thermoplastics or thermoset resins, with thermoset resins including silicones, phenolics, and epoxies.

Still referring to FIG. 1, semiconductor chip 41 is attached to paddle 42. A plurality of connecting pads 46 are located on semiconductor chip 41. A plurality of leads 44 surround, but do not touch, semiconductor chip 41 and paddle 42. Wires 43 connect the connecting pads 46 to leads 44. Leads 44 are generally rectangular in cross-section. Leads 44 are located along the periphery of semiconductor package 40 for connection with a printed circuit board (not shown). Sealing material 45 encapsulates leads 44, wires 43, and semiconductor chip 41 except for the bottommost surfaces of paddle 42 and leads 44. Since sealing material 45 is nonconductive, if a second prior art semiconductor package (not shown) is stacked on top of semiconductor package 40, the second prior art semiconductor package cannot operate because it has no electrical path to connect to. Thus, it is difficult if not impossible for prior art MLF-type semiconductor packages to be stacked on top of each other and still operate as intended.

Still referring to FIG. 1, in MLF-type semiconductor packages, heat generated from the operation of semiconductor chip 41 is dissipated via a lower exposed surface of paddle 42 and the lower and lateral exposed surfaces of leads 44. Thus, when prior art MLF-type semiconductor packages are stacked on each other-even if the electrical connection problem is solved—the top of the bottom semiconductor package touches the bottom of the top semiconductor package and obstructs the heat flow from the second semiconductor package to the outside, thereby preventing proper heat dissipation by the second semiconductor package.

Figure 2:
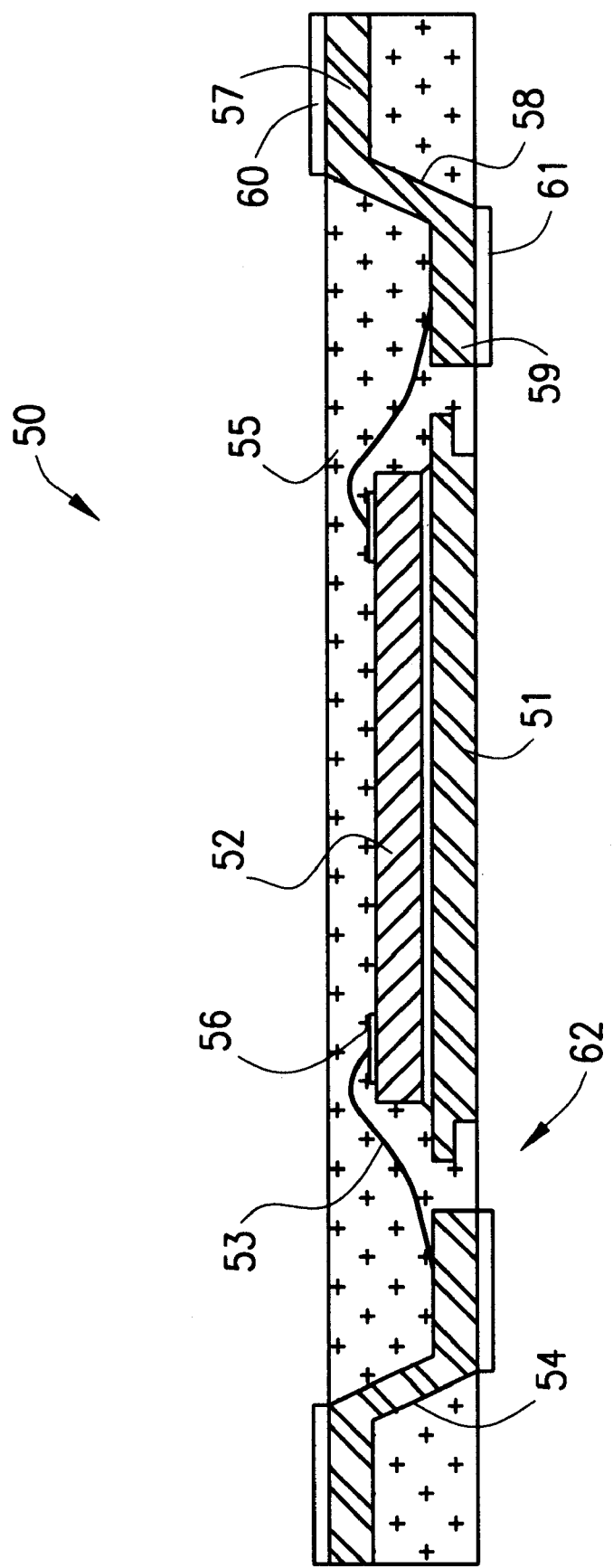
FIG. 2 is a side-elevational, cross-sectional view of a first embodiment of a semiconductor package constructed in accordance with the principles of the present invention.

Referring to FIG. 2, there is shown a side-elevational, cross-sectional view of semiconductor package 50, which is a first embodiment of a semiconductor package constructed in accordance with the principles of the present invention. Semiconductor package 50 has a leadframe 62, a semiconductor chip 52, and a plurality of thin wires 53. The components listed above are enclosed in a nonconductive sealing material 55 made of thermoplastics or thermoset resins, with the thermoset resins including silicones, phenolics, and epoxies.

Still referring to FIG. 2, semiconductor package 50 has a leadframe 62. Leadframe 62 has a paddle 51 and leads 54. Paddle 51 and leads 54 are secured to leadframe 62 by a tie bar (not shown because it is trimmed off as one of the last steps in the semiconductor chip packaging process). Paddle 51 has a top side, a bottom side, and may, but does not necessarily have to have, a lateral etched side. The lateral etched side, if present, increases the locking strength between paddle 51 and sealing material 55. The top side of paddle 51 is attached to semiconductor chip 52 while the bottom side of paddle 51 is exposed to the outside of semiconductor package 50. The bottom exposed side of paddle 51 is electroplated with a corrosion-minimizing material such as, for example, tin, gold, tin lead, tin bismuth, nickel palladium, or an alloy thereof The bottom side of paddle 51 may be attached to a printed circuit board (not shown) or another semiconductor package constructed in accordance with the principles of the present invention. Paddle 51 is made of an electrically and heat conducting material such as, for example, copper. Heat generated from the operation of semiconductor chip 52 can be dissipated to the outside of semiconductor package 50 through the bottom side of paddle 51.

Still referring to FIG. 2 and leadframe 62, a plurality of leads 54 surround but do not touch paddle 51. Leads 54 are roughly "S" shaped and are made of electrically conductive material such as, for example, copper. Because all leads 54 are generally similar in construction, only one of the leads 54a will be described in detail below. It should be understood that the description of lead 54a applies to all leads 54, though for clarity, only lead 54 is shown.

Still referring to FIG. 2, lead 54a can be further subdivided into three portions: upper portion 57, middle portion 58, and lower portion 59. A small section 60 of the top side of upper portion 57 protrudes out of the top surface of semiconductor package 50. Similarly, a small section 61 of the bottom side of lower portion 59 protrudes out of the bottom surface of semiconductor package 50. Sections 60 and 61 are made of an electrically conductive material such as, for example, a solder plate attached to upper portion 57 and lower portion 59. Sections 60 and 61 are used to physically and electrically connect semiconductor package 50 to an integrated circuit board (not shown) or another semiconductor package (not shown). Further, sections 60 and 61 are also used to form a space (not shown) between semiconductor package 50 and another semiconductor package. The space (not shown) facilitates heat dissipation. Possible configurations for stacking the semiconductor packages will be described later below.

Still referring to FIG. 2, semiconductor package 50 has a semiconductor chip 52 attached to paddle 51 via an adhesive. A plurality of leads 54 electrically connect to semiconductor chip 52 through a plurality of wires 53. Each one of the wires 53 has a first side electrically connected to one of the bond pads 56 located on the top side of semiconductor chip 52 and a second side connected to lower portion 59 of one of the internal leads 54. Wires 53 can be made of any electrically conductive material such as, for example, gold, aluminum, or silver.

Semiconductor chip 52, paddle 51, wires 53, and leads 54 are all encapsulated by sealing material 55. Sealing material 55 is nonconductive and can be thermoplastics or thermoset resins, with thermoset resins including silicones, phenolics, and epoxies. Sealing material 55 preserves the spacial relationship between paddle 51, wires 53, and leads 54 of semiconductor package 50. Sealing material 55 also protects the components of semiconductor package 50 from damage. More specifically, except for the small sections 60 and 61, leads 54 are completely enclosed by sealing material 55, thus preventing another object from touching and accidentally shorting leads 54. The exposed parts of the leadframe—small sections 61, 66, and the bottom of paddle 51—are coated or electroplated with a protective material such as, for example, tin, gold, tin lead, tin bismuth, nickel palladium, or an alloy thereof.

Figure 3:
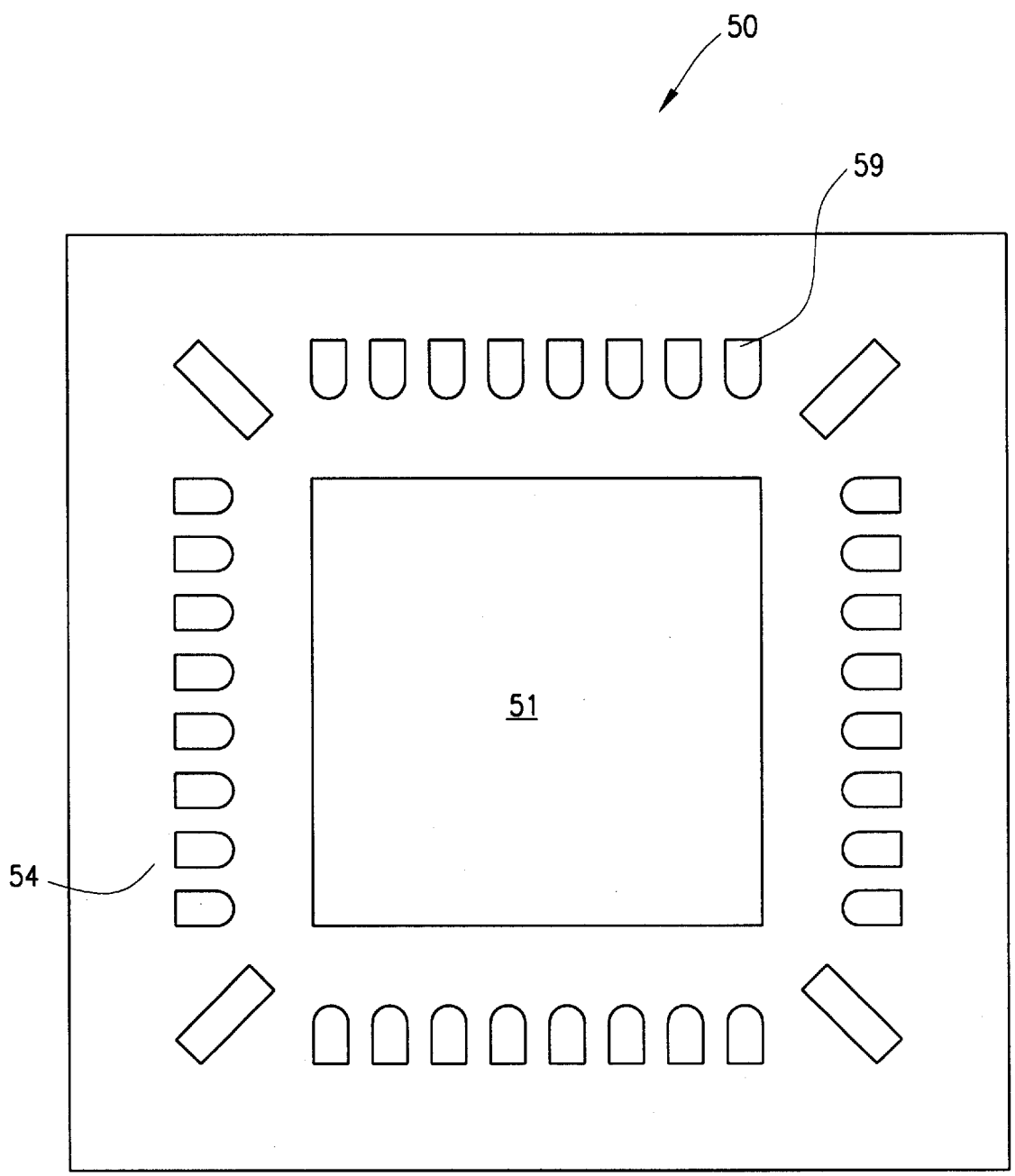
FIG. 3 is a bottom plan view of a first embodiment of a semiconductor package constructed in accordance with the principles of the present invention.

Referring now to FIG. 3, there is shown a bottom plan view of semiconductor package 50. As shown in FIG. 3, paddle 51 is located generally in the middle of semiconductor package 50 and surrounded by a plurality of leads 54. Only the lower portion 59 of the internal leads 54 are visible from this bottom plan-view of semiconductor package 50.

Figure 4:
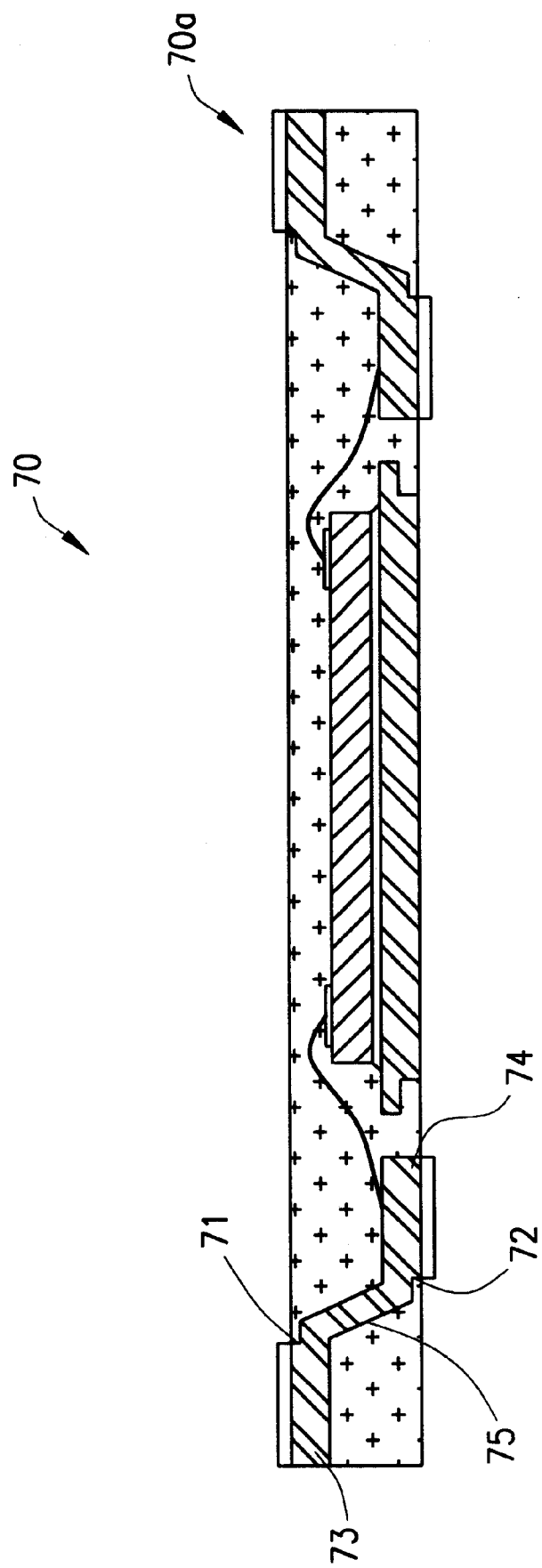
FIG. 4 is a side-elevational, cross-sectional view of a second embodiment of a semiconductor package constructed in accordance with the principles of the present invention.

Referring now to FIG. 4, there is shown a side-elevational, cross-sectional view semiconductor package 70, which is a second embodiment of the semiconductor package constructed in accordance with the principles of the present invention. Semiconductor package 70 is generally similar to semiconductor package 50 in construction except semiconductor package 70 has etching portions 71 and 72 on leads 75 of leadframe 70a. Etching portions 71 and 72 form a part of upper portion 73 and lower portion 74 of each one of the leads 75 of semiconductor package 70. Etching portions 71 and 72 increase the locking strength between leads 75 and sealing material 76 to minimize the possibility of leads 75 from becoming detached from semiconductor package 70. Etching portions 71 and 72 also help to suppress movement of internal leads 75 within semiconductor package 70.

Figure 5:
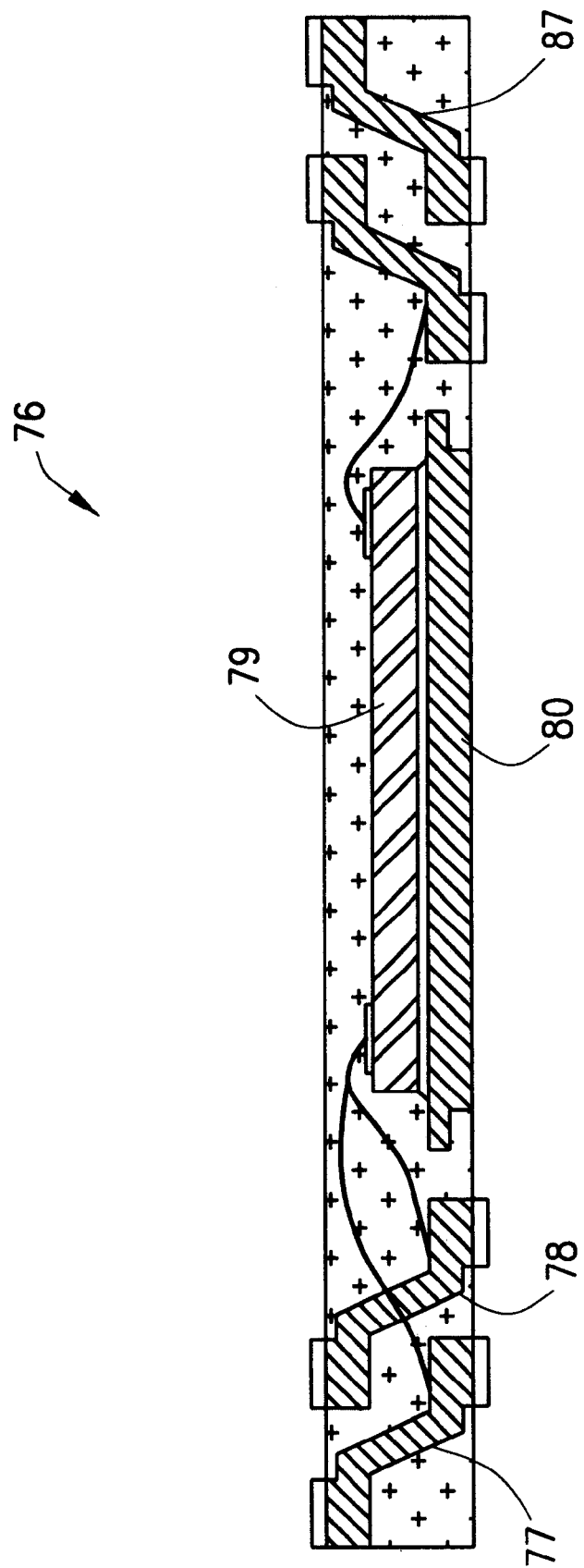
FIG. 5 is a side-elevational, cross-sectional view of a third embodiment of a semiconductor package constructed in accordance with the principles of the present invention.

Referring now to FIG. 5, there is shown a cross-sectional, side-elevational view of semiconductor package 76, which is a third embodiment of the semiconductor package constructed in accordance with the principles of the present invention. In addition to having all of the components of semiconductor package 50, semiconductor package 76 has two rows 77 and 78 of leads 87 surrounding semiconductor chip 79 and paddle 80.

Figure 6:
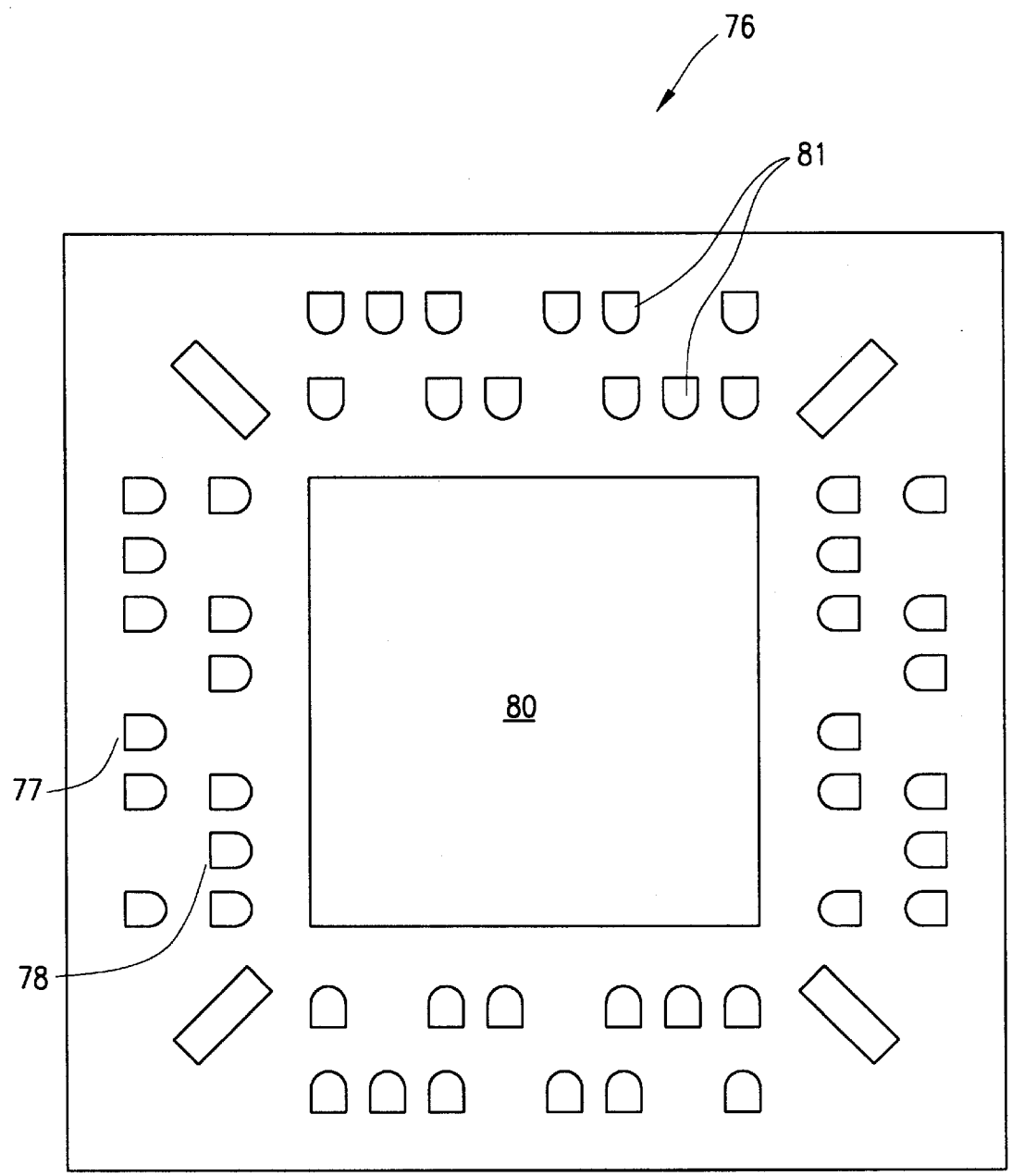
FIG. 6 is a bottom plan view of a third embodiment of a semiconductor package constructed in accordance with the principles of the present invention.

Referring now to FIG. 6, there is shown a bottom plan view of semiconductor package 76. As shown by FIG. 6, rows 77 and 78 have randomly placed leads 81 surrounding paddle 80.

Figure 7:
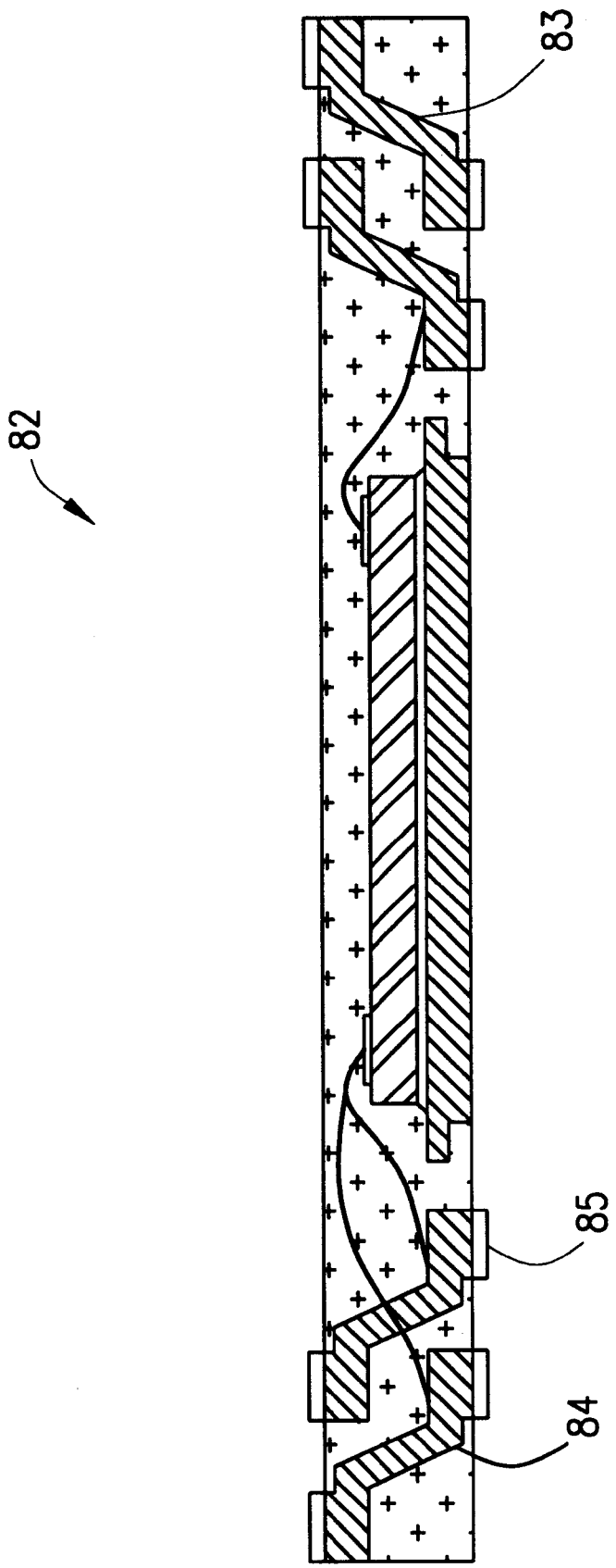
FIG. 7 is a side-elevational, cross-sectional view of a fourth embodiment of a semiconductor package constructed in accordance with the principles of the present invention.
Figure 8:
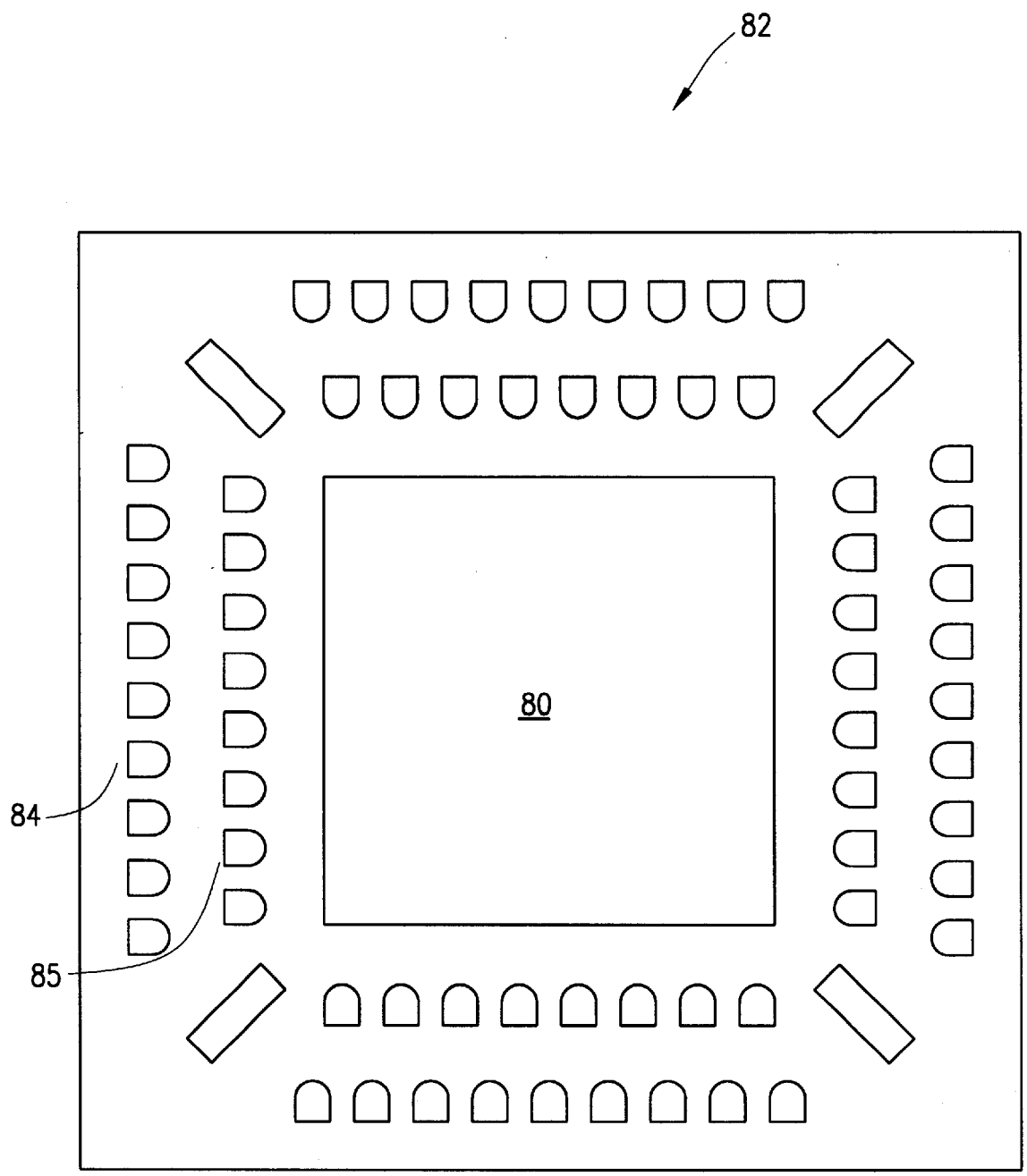
FIG. 8 is a bottom plan view of a fourth embodiment of a semiconductor package constructed in accordance with the principles of the present invention.

Referring now to FIGS. 7 and 8 together, there is shown a side-elevational, cross-sectional view and a bottom plan view of semiconductor package 82, which is a fourth embodiment of a semiconductor package constructed in accordance with the principles of the present invention. Semiconductor package 82 differs from the other embodiments of the present invention in that the leads 83 in rows 84 and 85, as shown in FIG. 8, are lined up at regular intervals.

Figure 9:
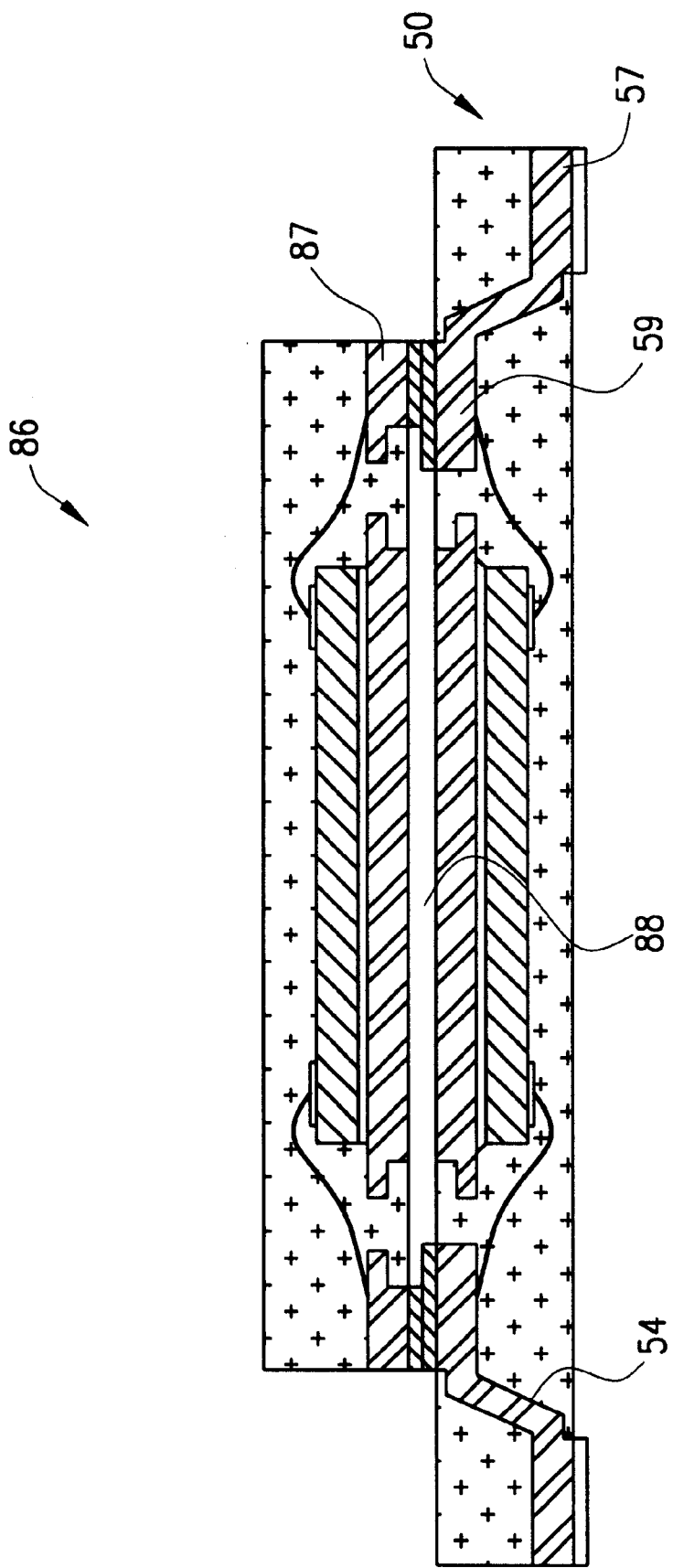
FIG. 9 is a side-elevational, cross-sectional view of a first method for stacking a prior art semiconductor package with a first embodiment of a semiconductor package constructed in accordance with the principles of the present invention.

Referring now to FIG. 9, there is shown a side-elevational, cross-sectional view of a first method of stacking a prior art semiconductor package 86 onto semiconductor package 50, which is a first embodiment of a semiconductor package constructed in accordance with the principles of the present invention. Semiconductor package 50 is turned upside down so that the upper portion 57 of leads 54 can be attached to a printed circuit board (not shown) or attached to another semiconductor package of the present invention (not shown) having leads in generally the same place as semiconductor package 50. The bottom surface of semiconductor package 50 is now turned up so that lower portion 59 of leads 54 faces upwards. Prior art semiconductor package 86 is then placed on top of semiconductor package 50 so that leads 87 of semiconductor package 86 physically connect and electrically contact with the lower portion 59 of leads 54 of semiconductor package 50. Because the lower portion 59 of the leads 54 protrudes slightly out of semiconductor package 50, the protrusion creates a space 88. This space 88 allows increased heat dissipation by both prior art semiconductor package 86 and semiconductor package 50. The semiconductor packages 50 and 86 are held in this stacked position by applying solder—or any material commonly used in the art—between the semiconductor packages and/or between a semiconductor package and a printed circuit board.

Figure 10:
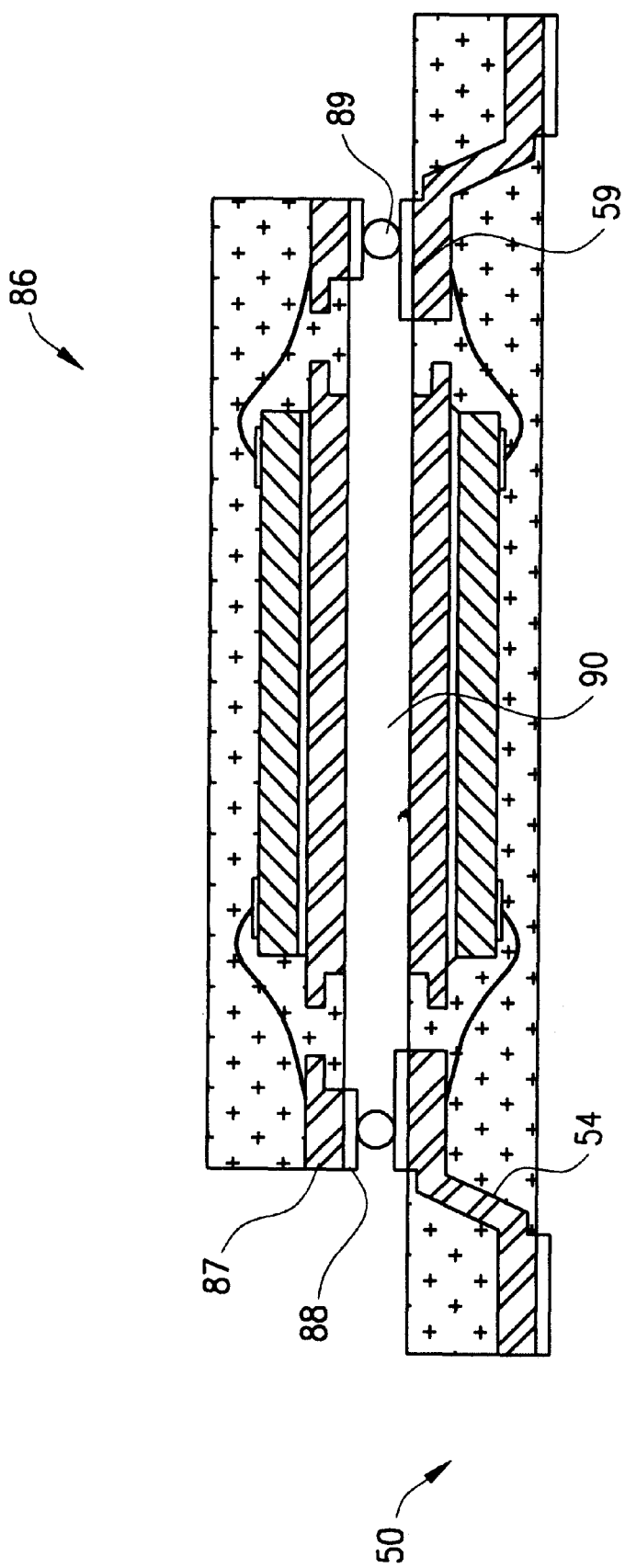
FIG. 10 is a side-elevational, cross-sectional view of a second method of stacking a prior art semiconductor package with a first embodiment of a semiconductor package constructed in accordance with the principles of the present invention.

Referring now to FIG. 10, there is shown a side-elevational, cross-sectional view of a second method for stacking a prior art semiconductor package 86 onto semiconductor package 50. The orientation and physical locations of the semiconductor packages 86 and 50 remain the same as the method already discussed above. However, a plurality of solder plate layers 88 are attached to the leads 87 of prior art semiconductor package 86 so that solder plate layers 88 protrude out of the bottom surface of prior art semiconductor package 86. A plurality of solder balls 89 are sandwiched between solder plate layers 88 and the lower portion 59 of leads 54 of semiconductor package 50. The solder balls 89 create a space 90 between prior art semiconductor package 86 and semiconductor package 50 for heat dissipation.

Figure 11:
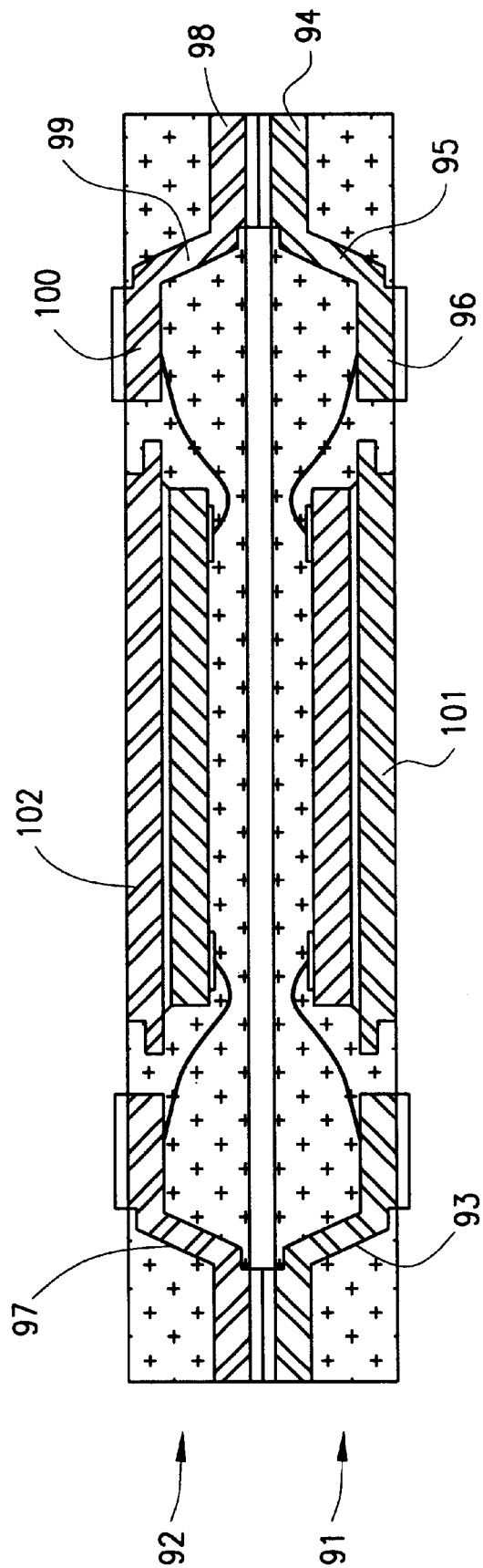
FIG. 11 is a side-elevational, cross-sectional view of a third method of stacking two semiconductor packages of the first embodiment of the semiconductor package constructed in accordance with the principles of the present invention.

Referring now to FIG. 11, there is shown a side-elevational, cross-sectional view of a third method for stacking semiconductor packages constructed in accordance with the principles of the present invention. A first semiconductor package 91 is attached right side up either to a printed circuit board (not shown) or to another semiconductor package (not shown) constructed in accordance with the principles of the present invention. Semiconductor package 91 has a plurality of leads 93. Each one of the leads 93 has an upper portion 94, a middle portion 95, and a lower portion 96. Upper portion 94 and lower portion 96 protrude out of semiconductor package 91 to allow electric conductivity.

Still referring to FIG. 11, semiconductor package 92 also has a plurality of leads 97. Each one of the leads 97 also has an upper portion 98, a middle portion 99, and a lower portion 100. Semiconductor package 92 is turned upside down and physically and electrically attached to semiconductor package 91. Because semiconductor package 92 is turned upside down, upper portion 98 of internal leads 97 comes into physical and electrical contact with upper portion 94 of internal leads 93 of semiconductor package 91. Electrical current can flow between semiconductor packages 91 and 92. Semiconductor packages 91 and 92 are held in this stacked position by applying solder—or any material commonly used in the art—between the semiconductor packages and/or between a semiconductor package and a printed circuit board.

Still referring to FIG. 11, additional semiconductor packages can be stacked onto semiconductor package 92 by physically and electrically connecting lower portion 100 of lead 97 to a lower portion of another semiconductor package having leads in generally the same places as semiconductor package 92. As shown in FIG. 11, heat produced by the electrical activities within semiconductor packages 91 and 92 can dissipate because paddles 101 and 102 do not touch. It should be noted that a plurality of solder balls (not shown) may also be sandwiched between upper portion 94 of lead 93 of semiconductor package 91 and upper portion 98 of lead 97 of semiconductor package 92.

Figure 12:
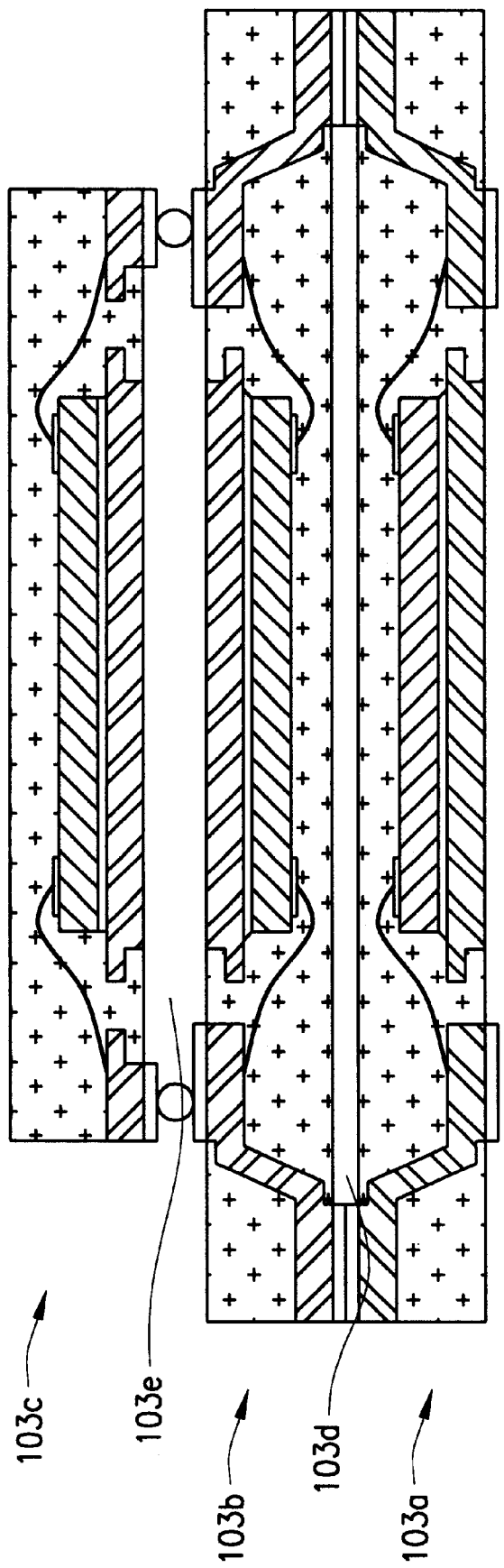
FIG. 12 is a side-elevational, cross-sectional view of a fourth method of stacking a plurality of semiconductor packages with a first embodiment of a semiconductor package constructed in accordance with the principles of the present invention.

Referring now to FIG. 12, there is shown a side-elevational, cross-sectional view of a fourth method of stacking the semiconductor packages constructed in accordance with the principles of the present invention. FIG. 12 shows semiconductor packages 103a, 103b, and 103c. The bottom side of semiconductor package 103a can be physically and electrically connected to another semiconductor package (not shown) or to a printed circuit board (not shown). Semiconductor package 103b is stacked onto and electrically connected to semiconductor package 103a using the method and configuration disclosed in FIG. 11 above. Semiconductor package 103c is stacked on top of and electrically connected to semiconductor package 103b using the method disclosed in FIG 10 above. Note spaces 103c and 103d between semiconductor packages 103a, 103b, and 103c allow heat dissipation between the semiconductor packages.

Figure 13:
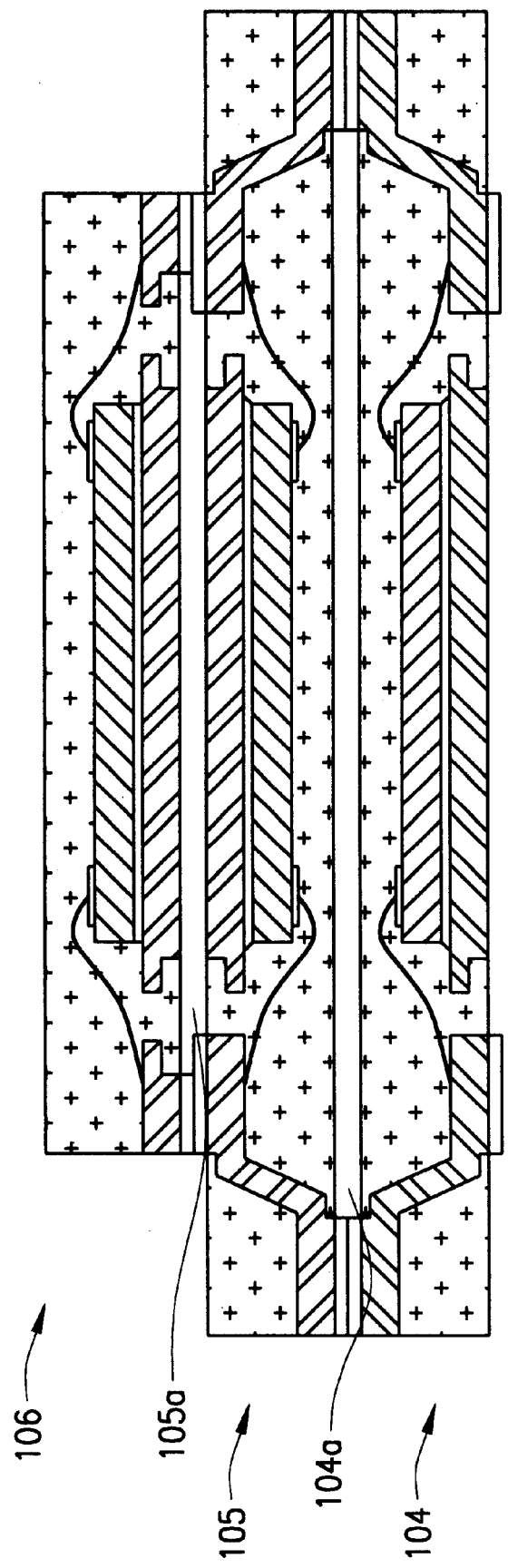
FIG. 13 is a side-elevational, cross-sectional view of a fifth method of stacking a plurality of semiconductor packages with a first embodiment of a semiconductor package constructed in accordance with the principles of the present invention.

Referring now to FIG. 13, there is shown a side-elevational, cross-sectional view of a fifth method of stacking the semiconductor packages constructed in accordance with the principles of the present invention. FIG. 13 shows semiconductor packages 104, 105, and 106. Semiconductor packages 104 and 105 are stacked on each other using the method shown and described in FIG. 11 above. Semiconductor packages 105 and 106 are stacked on each other using the method shown and described in FIG. 9 above. Semiconductor package 104 may be attached either to a printed circuit board (not shown) or to another semiconductor package (not shown) having leads located generally in the same place as semiconductor package 104. Spaces 104a and 105a between semiconductor packages, 104, 105, and 106 allow for heat dissipation.

Figure 14:
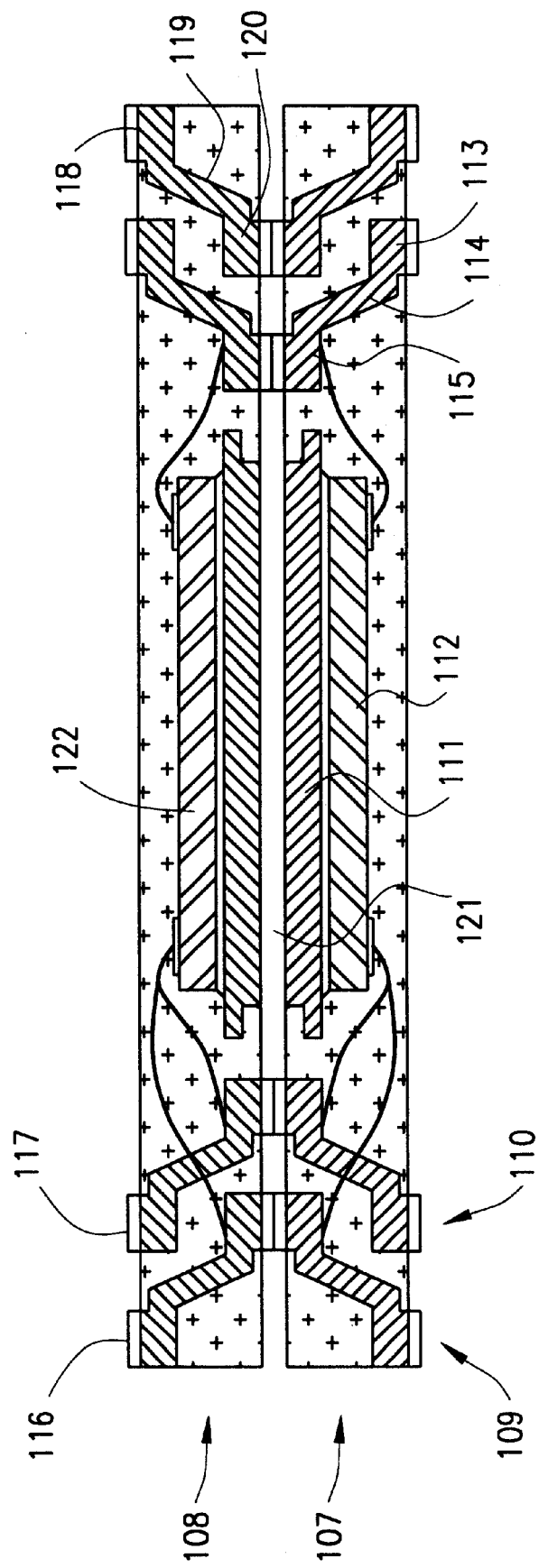
FIG. 14 is a side-elevational, cross-sectional view of a sixth method of stacking a third embodiment of a semiconductor package constructed in accordance with the principles of the present invention with another third embodiment of a semiconductor package constructed in accordance with the principles of the present invention.

Referring now to FIG. 14, there is shown a side-elevational, cross-sectional view of a method for stacking semiconductor packages 107 and 108 both having a cross section of the fourth embodiment of the semiconductor package constructed in accordance with the principles of the present invention. Semiconductor package 107 has a first series of leads 109 and a second series of leads 110. Both first and second series of leads 109 and 110 surround the paddle 111 and semiconductor chip 112 of semiconductor package 107. Each lead in the first and second series of leads 109 and 110 has an upper portion 113, a middle portion 114, and a lower portion 115.

Still referring to FIG. 14, semiconductor package 108 also has a first series of leads 116 and a second series of leads 117. Each lead in the first and second series of leads 116 and 117 also has an upper portion 118, a middle portion 119, and a lower portion 120. The first and second series of leads 116 and 117 are arranged at generally the same location as the first and second series of leads 109 and 110 of semiconductor package 107.

Still referring to FIG. 14, semiconductor packages 107 and 108 are stacked on each other by flipping semiconductor package 107 upside down so that the lower portion 115 of each lead in the first and second series of internal leads 109 and 110 come into physical contact and are electrically connected with the lower portion 120 of each lead in the first and second series of leads 116 and 117 of semiconductor package 108. Upper portion 117 of each lead in the first and second series of leads 109 and 110 in semiconductor package 107 can either be physically attached to and electrically connected with a printed circuit board (not shown) or another semiconductor package (not shown) having leads located generally at the same place as semiconductor package 107. A semiconductor package of the present invention having leads at generally the same place as semiconductor package 108 can also be attached to semiconductor package 108. Thereafter, a prior art semiconductor package or another semiconductor package constructed in accordance with the principles of the present invention can be stacked onto the entire stack. Semiconductor packages 107 and 108 are held in their stacked position by applying solder—or any other material commonly used in the art—between the semiconductor packages and/or between a semiconductor package and a printed circuit board.

Still referring to FIG. 14, a space 121 is created when semiconductor package 107 is physically attached to semiconductor package 108. The heat generated by the semiconductor chip 112 and 122 in semiconductor packages 107 and 108 can be dissipated through space 121. Though not shown, a plurality of solder balls can be sandwiched between lower portions 115 and the lower portions 120.

Figure 15:
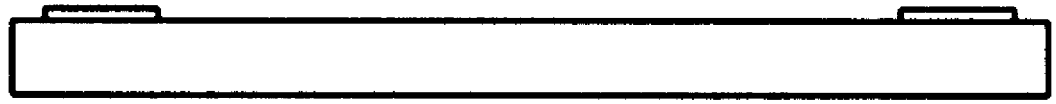
FIG. 15 is a side-elevational, cross-sectional view of a first step in the manufacturing method of one embodiment of a semiconductor package constructed in accordance with the principles of the present invention.
Figure 16:
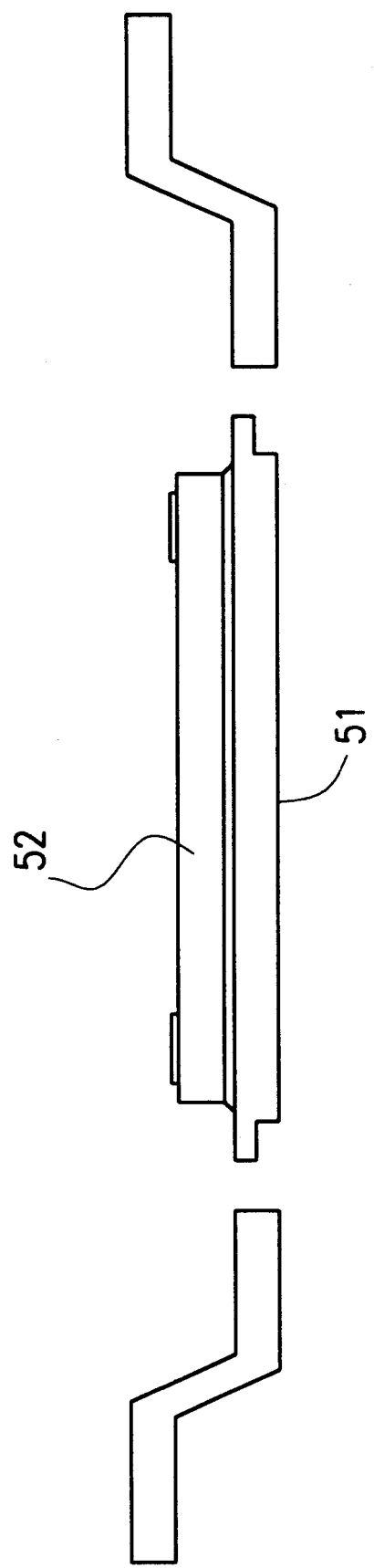
FIG. 16 is a side-elevational, cross-sectional view of a second step in the manufacturing method of one embodiment of a semiconductor package constructed in accordance with the principles of the present invention.
Figure 17:
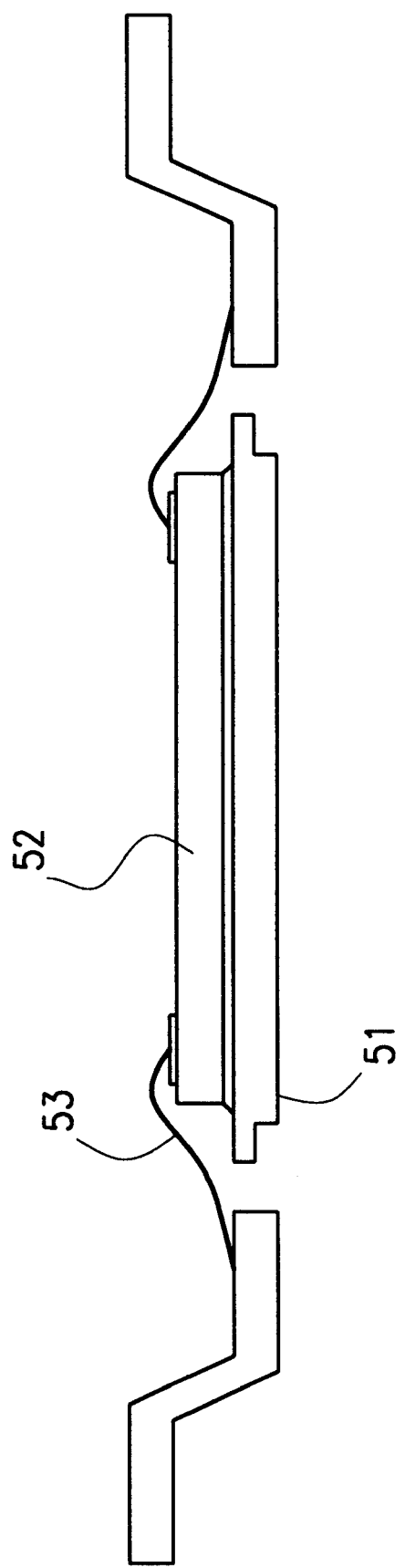
FIG. 17 is a side-elevational, cross-sectional view of a third step in the manufacturing method of one embodiment of a semiconductor package constructed in accordance with the principles of the present invention.
Figure 18:
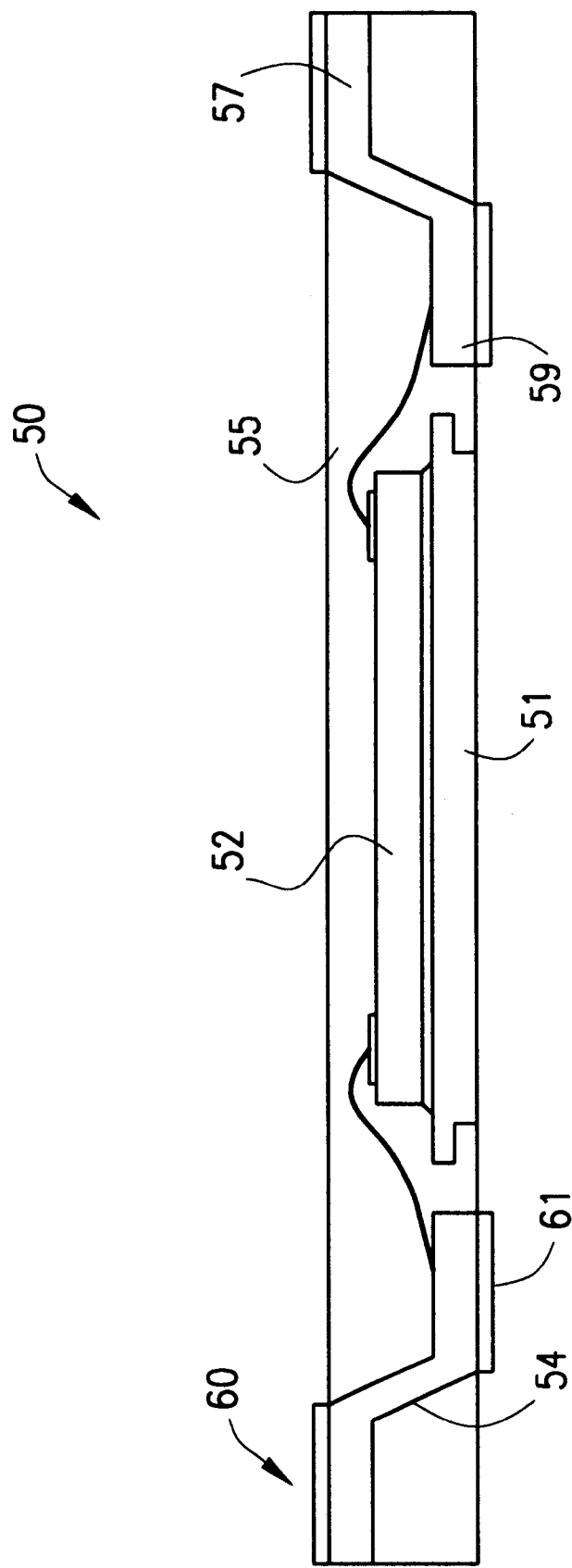
FIG. 18 is a side-elevational, cross-sectional view of a fourth step in the manufacturing method of one embodiment of a semiconductor package constructed in accordance with the principles of the present invention.

Referring now to FIGS. 15 through 18, there is shown in cross-sectional and side-elevational views of a method for manufacturing the semiconductor packages constructed in accordance with the principles of the present invention. For illustrative purposes, the method for manufacturing semiconductor package 50 will be described below. Variations in the method for manufacturing other embodiments will be noted. To manufacture semiconductor package 50, a semiconductor chip 52 is first obtained (FIG. 15). Then, semiconductor chip 52 is attached to leadframe 62 via an adhesive (FIG. 16). It should be noted that other types of leadframes of other embodiments of the present invention, such as leadframe 70a, may be used in place of leadframe 62. Then, wires 53 are connected from semiconductor chip 52 to the plurality of leads 54 (FIG. 17). Sealing material 55 is melted, poured on to leadframe 62, semiconductor chip 52, and wires 53, and then allowed to harden, thus encapsulating the components of semiconductor package 50. Small sections 60 and 61 are attached to the upper and lower portions 57 and 59 of leads 54. Excess sealing material 55 and lead frame 62 are trimmed to their desired shape and lengths by hand or by using a trimming machine. Finally, the exposed portions of leadframe 62 are coated or electroplated with a corrosion-minimizing material such as, for example, tin, gold, tin lead, nickel palladium, tin bismuth, or other similar materials.

Although a preferred embodiment of the method and apparatus of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

The following applications are all being filed on the same date as the present application and all are incorporated by reference as if wholly rewritten entirely herein, including any additional matter incorporated by reference therein:

| Application Number | Title of Application | First Named Inventor |
|---|---|---|
| 09/687,485 | Semiconductor Package Having Increased Solder Joint Strength | Kil Chin Lee |
| 09/687,487 | Clamp and Heat Block Assembly For Wire Bonding a Semiconductor Package Assembly | Young Suk Chung |
| 09/687,876 | Near Chip Size Semiconductor Package | Sean Timothy Crowley |
| 09/687,495 | Semiconductor Package | Sean Timothy Crowley |
| 09/687,530 | Stackable Semiconductor Package and Method for Manufacturing Same | Jun Young Yang |
| 09/687,126 | Method of and Apparatus for Manufacturing Semiconductor Packages | Hyung Ju Lee |
| 09/687,493 | Semiconductor Package Having Improved Adhesiveness and Ground Bonding | Sung Sik Jang |
| 09/687,541 | Semiconductor Package Leadframe Assembly and Method of Manufacture | Young Suk Chung |

It is thus believed that the operation and construction of the present invention will be apart from the foregoing description of the preferred exemplary embodiments. It will be obvious to a person of ordinary skill in the art that various changes and modifications may be made herein without departing from the spirit and scope of the invention.

What is claimed is:

1. A semiconductor package, comprising:
    a leadframe comprising:
        a die paddle defining opposed, generally planar top and bottom surfaces; and
        a plurality of leads extending at least partially about the die paddle in spaced relation thereto, each of the leads having:
            an upper portion defining a generally planar top side;
            a lower portion defining a generally planar bottom side; and
            a middle portion extending between the upper and lower portions;
    a semiconductor chip attached to the top surface of the die paddle and electrically connected to at least one of the leads; and
    a sealing material at least partially encapsulating the leadframe and the semiconductor chip such that the bottom sides of the lower portions of the leads and the top sides of the upper portions of the leads are exposed within the sealing material.

2. The semiconductor package of claim 1 wherein the semiconductor chip is electrically connected to the lower portion of the at least one of the leads via a conductive wire which is encapsulated by the sealing material.

3. The semiconductor package of claim 2 wherein:
    the lower portion of each of the leads includes a bond side which is disposed in opposed relation to the bottom side and extends in generally co-planar relation to the top surface of the die paddle; and
    the conductive wire is connected to the bond side of the lower portion of the at least one of the leads.

4. The semiconductor package of claim 1 wherein the bottom surface of the die paddle is exposed within the sealing material and extends in generally co-planar relation to the bottom sides of the lower portions of the leads.

5. The semiconductor package of claim 4 wherein the die paddle includes a notched portion which extends about the bottom surface thereof and is filled with the sealing material.

6. The semiconductor package of claim 1 wherein the upper and lower portions of each of the leads each include an etched portion which is formed therein and filled with the sealing material.

7. The semiconductor package of claim 1 further comprising:
    a top section attached to the top side of the upper section of each of the leads and sized to protrude outwardly from the sealing material; and
    a bottom section attached to the bottom side of the lower section of each of the leads and sized to protrude outwardly from the sealing material.

8. The semiconductor package of claim 7 wherein the top and bottom sections each comprise a solder plate.

9. A semiconductor package, comprising:
    a die paddle defining opposed, generally planar top and bottom surfaces;
    a first set of leads extending at least partially about the die paddle in spaced relation thereto; and
    a second set of leads extending at least partially about the leads of the first set in spaced relation thereto, each of the leads of the first and second sets having:
        an upper portion defining a generally planar top side;
        a lower portion defining a generally planar bottom side;. and
        a middle portion extending between the upper and lower portions;
    a semiconductor chip attached to the top surface of the die paddle and electrically connected to at least one of the leads of each of the first and second sets; and
    a sealing material at least partially encapsulating the leadframe and the semiconductor chip such that the bottom sides of the lower portions of the leads of the first and second sets and the top sides of the upper portions of the leads of the first and second sets are exposed within the sealing material.

10. The semiconductor package of claim 9 wherein the semiconductor chip is electrically connected to the lower portions of at least one of the leads of each of the first and second sets via conductive wires which are encapsulated by the sealing material.

11. The semiconductor package of claim 10 wherein:
    the lower portion of each of the leads of the first and second sets includes a bond side which is disposed in opposed relation to the bottom side and extends in generally co-planar relation to the top surface of the die paddle; and the conductive wires are connected to the bond sides of the lower portions of the at least one of the leads of each of the first and second sets.

12. The semiconductor package of claim 9 wherein the bottom surface of the die paddle is exposed within the sealing material and extends in generally co-planar relation to the bottom sides of the lower portions of the leads of each of the first and second sets.

13. The semiconductor package of claim 12 wherein the die paddle includes a notched portion which extends about the bottom surface thereof and is filled with the sealing material.

14. The semiconductor package of claim 9 wherein the upper and lower portions of each of the leads of each of the first and second sets each include an etched portion which is formed therein and filled with the sealing material.

15. The semiconductor package of claim 9 further comprising:
    a top section attached to the top side of the upper section of each of the leads of the first and second sets and sized to protrude outwardly from the sealing material; and
    a bottom section attached to the bottom side of the lower section of each of the leads of the first and second sets and sized to protrude outwardly from the sealing material.

16. The semiconductor package of claim 15 wherein the top and bottom sections each comprise a solder plate.

17. A leadframe comprising:
    a die paddle defining opposed, generally planar top and bottom surfaces; and
    a plurality of leads extending at least partially about the die paddle in spaced relation thereto, each of the leads having:
        an upper portion defining a generally planar top side;
        a lower portion defining a generally planar bottom side; and
        a middle portion extending between the upper and lower portions;
        the bottom sides of the lower portions of the leads and the bottom surface of the die paddle extending in generally co-planar relation to each other, with the top sides of the upper portions of the leads extending along a common plane which is disposed above and extends in generally parallel relation to the top surface of the die paddle.

18. The leadframe of claim 17 wherein the die paddle includes a notched portion which extends about the bottom surface thereof.

19. The leadframe of claim 17 wherein the upper and lower portions of each of the leads each include an etched portion formed therein.

20. A leadframe comprising:
    a die paddle defining opposed, generally planar top and bottom surfaces;
    a first set of leads extending at least partially about the die paddle in spaced relation thereto; and
    a second set of leads extending at least partially about the leads of the first set in spaced relation thereto, each of the leads of the first and second sets having:
        an upper portion defining a generally planar top side;
        a lower portion defining a generally planar bottom side; and
        a middle portion extending between the upper and lower portions;
        the bottom sides of the lower portions of the leads of the first and second sets and the bottom surface of the die paddle extending in generally co-planar relation to each other, with the top sides of the upper portions of the leads of the first and second sets extending along a common plane which is disposed above and extends in generally parallel relation to the top surface of the die paddle.

21. The leadframe of claim 20 wherein the die paddle includes a notched portion which extends about the bottom surface thereof.

22. The leadframe of claim 20 wherein the upper and lower portions of each of the leads of each of the first and second sets each include an etched portion formed therein.

23. A chip stack comprising:
    first and second semiconductor packages, each of which comprises:
        a leadframe comprising:
            a die paddle defining opposed, generally planar top and bottom surfaces; and
            a plurality of leads extending at least partially about the die paddle in spaced relation thereto, each of the leads having:
                an upper portion defining a generally planar top side;
                a lower portion defining a generally planar bottom side; and
                a middle portion extending between the upper and lower portions;
        a semiconductor chip attached to the top surface of the die paddle and electrically connected to at least one of the leads; and
        a sealing material at least partially encapsulating the leadframe and the semiconductor chip such that the bottom sides of the lower portions of the leads and the top sides of the upper portions of the leads are exposed within the sealing material;
    the top sides of the upper portions of the leads of the first semiconductor package being electrically connected to respective ones of the top sides of the upper portions of the leads of the second semiconductor package.

24. The chip stack of claim 23 further in combination with a third semiconductor package electrically connected to the bottom sides of the lower portions of the leads of one of the first and second semiconductor packages.

25. A chip stack comprising:
    first and second semiconductor packages, each of which comprises:
        a leadframe comprising:
            a die paddle defining opposed, generally planar top and bottom surfaces;
            a first set of leads extending at least partially about the die paddle in spaced relation thereto; and
            a second set of leads extending at least partially about the leads of the first set in spaced relation thereto, each of the leads of the first and second sets having:
                an upper portion defining a generally planar top side;
                a lower portion defining a generally planar bottom side; and
                a middle portion extending between the upper and lower portions;
        a semiconductor chip attached to the top surface of the die paddle and electrically connected to at least one of the leads of each of the first and second sets; and
        a sealing material at least partially encapsulating the leadframe and the semiconductor chip such that the bottom sides of the lower portions of the leads of the first and second sets and the top sides of the upper portions of the leads of the first and second sets are exposed within the sealing material;

the bottom sides of the lower portions of the leads of the first set of the first semiconductor package being electrically connected to respective ones of the bottom sides of the lower portions of the leads of the first set of the second semiconductor package, with the bottom sides of the lower portions of the leads of the second set of the first semiconductor package being electrically connected to respective ones of the bottom sides of the lower portions of the leads of the second set of the second semiconductor package.

* * * * *